SECTION B-B

INVENTOR: MARION E. HINES
By Alfred H. Rosen
Attorney

HIGH POWER SOLID STATE MICROWAVE DEVICE

Filed Nov. 24, 1967 6 Sheets-Sheet 2

INVENTOR: MARION E. HINES
By Alfred H. Rosen
Attorney

INVENTOR: MARION E. HINES

By Alfred H. Rosen
Attorney

Jan. 12, 1971 M. E. HINES 3,555,444

HIGH POWER SOLID STATE MICROWAVE DEVICE

Filed Nov. 24, 1967

INVENTOR: MARION E. HINES

By [signature]

Attorney

INVENTOR: MARION E. HINES

By Alfred H. Rosen
Attorney

INVENTOR: MARION E. HINES
By Alfred H. Rosen
Attorney

United States Patent Office 3,555,444

Patented Jan. 12, 1971

3,555,444

HIGH POWER SOLID STATE MICROWAVE DEVICE

Marion E. Hines, Weston, Mass., assignor to Microwave Associates, Inc., Burlington, Mass., a corporation of Massachusetts Filed Nov. 24, 1967, Ser. No. 685,611

Int. Cl. H03f *15/00*

U.S. Cl. 330—61 2 Claims

ABSTRACT OF THE DISCLOSURE

Solid-state microwave devices are disclosed which generate and amplify microwave energy at higher power levels than are attainable with prior types. In one embodiment of the invention a thin semiconductor sheet is biased to carry electric current along the surface. The surface is overlaid with a thin dielectric layer which is further overlaid with a mosaic pattern of narrow metallic stripes. Negative resistance effects, resulting in high frequency oscillation or amplification, occur through interaction of the moving electric charges with high frequency electric fields induced between the stripes.

BACKGROUND OF THE INVENTION

The field of this invention is microwave generation and amplification of high power, utilizing solid state devices.

Microwave generators in the prior art may be found in two principal types, electron tube devices and solid state devices. Microwave electron tubes have been used almost exclusively in generating high power at microwave frequencies. Among these devices are klystrons, magnetrons, traveling wave tubes, backward wave tubes and triodes. Klystron tubes are generally characterized by the interaction of an electron beam and a resonant cavity or cavities such that beam bunches and debunches are produced with electron distance traveled, and subsequent transfer of microwave power from the electron beam to a resonant cavity. Oscillations may be sustained by feeding back a portion of the power output to the input circuit and adjusting the electron transit angle. Magnetrons are basically crossed electric and magnetic field devices, with a periodic circuit whose basic structure is bent around in a circle so that the tube supplies its own input and thus becomes an oscillator. Traveling wave tubes were first described by Kompfner, R., in 1946. Their basic operation derives from the interaction of an electron beam with a fundamental or space harmonic slow wave of continuous or periodic slow-wave structure. In this tube, the electrons in the beam travel with velocities slightly greater than that of the wave and on the average are slowed down by the field of the wave; this kinetic energy is added to the radio frequency wave. In backward-wave tubes interaction occurs with the first reverse space harmonic, hence the circuit wave and the electron beam travel in opposite directions. The utilization of this extended interaction principle over-comes the electron transit-time limitation experienced with the gridded vacuum tubes of the triode variety. There has been a steady improvement upward in the power and frequency capability of microwave tubes. As an example, one high power klystron boasts 500,000 watts CW at 8 gHz., another traveling wave tube claims 7000 watts CW at 55 gHz., while still another O-type Backward Wave Oscillator boasts 365 watts CW at 100 gHz.

In comparison present state of the art microwave solid state generators are limited to less than 50 watts CW at 1 gHz.

Solid state radio frequency generators followed along the lines of the triode vacuum tube, by utilizing a transistor as an amplifier coupled to a tank circuit and by feeding back a portion of the output energy to sustain oscillations. Although repeated improvements have been made during recent years power generation is still limited to a few watts CW in the microwave frequency bands.

Several newer types of solid state microwave generators are now available commercially or their capability has been proved in development laboratories. One type is the avalanche diode oscillator first described by W. T. Read, "A Proposed High Frequency Negative Resistance Diode," Bell System Tech. Journal, March 1958, pp. 401–466. It operates through a negative RF resistance resulting from the combination of the avalanche process at reverse bias and the transit time of the carriers which drift at saturation velocity because of the high fields in the diode. This process necessitates a p-n junction biased into the avalanche mode, thus generating a steady stream of holes and electrons. These charge carriers drift under a high field at nearly constant velocity. By the application of microwave alternating voltages an interaction occurs with the current of the moving electrons in the drift zone to generate microwave power.

Another technique used to generate microwave power utilizing solid state devices is the Gunn effect. It was discovered by J. B. Gunn, "Microwave Oscillations of Current in III–V Semiconductors," Solid State Comm., vol. 1, September 1963, pp. 89–91 who noted that when gallium arsenide was subjected to a high electric field his samples exhibited unstable behavior which was later shown to be caused by internal microwave oscillations in the bulk material. A thin zone of high field was observed to form near the cathode which would then propagate toward the anode with little change in form during transit. A new wave would appear at the cathode as an old one disappeared at the anode. It has also been found that Gunn effect devices can operate in a bulk negative resistance mode. Devices utilizing these effects have been built at various laboratories. Most notable are those described by J. A. Copeland at the Bell Telephone Laboratories, "L.S.A. Oscillator Diode Theory," Journal of Applied Physics, July 1967, pp. 3096–3101 which provide CW powers on the order of .1 watt or less up to millimeter wave bands.

Still other solid state devices for generating microwave frequencies are the tunnel diode oscillator and the varactor harmonic generator as exemplified in Pats. Nos. 3,196,358 of M. E. Hines and 3,281,648 of F. P. Collins. In the tunnel diode oscillator use is made of the negative resistance characteristic of the tunnel diode when biased in the forward direction to sustain oscillations. However, power output is a serious problem because of the low voltages of these devices and 10 milliwatts has never been achieved at frequencies in the 10 gHz. region in spite of many efforts to do so.

Recently also microwave transistors operable at frequencies as high as 4 gHz. have made their appearance and can be used as a source of microwave power. When these devices are coupled to a varactor, power at still higher frequencies can be generated by the principle of harmonic generation.

One way around the power barrier is to apply to solid state devices the principle of extended interaction, which has pointed the way from the triode and klystron to the traveling wave tube and backward wave oscillator. It can be readily appreciated that if we have a material for which $\omega\tau \gg 1$ where $\omega$ is angular frequency, and $\tau$ is collision (relaxation) time, and in which one can attain drift velocities, $\nu_0$ which are large compared with the random thermal velocity $v_T$, the essential difference between vacuum and semiconductor electronic devices vanishes, that is the velocity of the electron or hole flow reaches a saturation point and remains constant with further increases of bias voltages. Recently the LSA (limited-space-charge accumulation) mode has been observed in gallium arsenide devices and Engelbrecht has drawn an analogy between the bulk semiconductor devices and extended interaction devices in that both types were designed to overcome transit time limitations. A more direct analogy is made by L. Solymar and E. A. Ash, "Some Traveling Wave Interaction in Semiconductors Theory and Design Considerations," Int. J. Electronics, 1966, vol. 20, No. 2, pp. 127–148 with their theoretical analysis of a solid state traveling wave amplifier, where they show that interaction can take place between the carriers of a semiconductor and a slow electromagnetic wave circuit which follows a meander line on the semiconductor. The authors reach the conclusion that such a solid state traveling wave amplifier is possible and predict a maximum gain of 4 db per wave length for fundamental operation and 0.3 db per wave length for space harmonic operation. Although it is possible to utilize such a traveling wave structure to interact with the carriers of the semiconductor in such a manner so as to generate microwave power, several difficulties are evident in physically implementing such a generator. For one, the traveling wave gain theories of Ash and Solymar predict extremely high gain per unit length so that it would be difficult to control oscillations and obtain their desired properties. Another disadvantage is that power would be limited to low values to avoid electrical breakdown. Still another disadvantage is that such a structure would exhibit extremely high radio frequency losses. Lastly the phase velocity of the traveling wave must be so slow in order to approximate the linear velocity of the electron or hole flow in the semiconductor that the structure must be composed of minute parts difficult to fabricate. Thus it is evident that the device described by Solymar and Ash has serious problems of a practical nature, and as far as is known it has not been successfully demonstrated.

The present invention overcomes these difficulties by avoiding this need for a slow-wave electromagnetic circuit on the semiconductor, while at the same time inducing standing electric field patterns in the semiconductor similar to those induced by traveling waves, which interact with an electromagnetic field to generate microwave power.

SUMMARY OF THE INVENTION

This invention relates in general to microwave electromagnetic wave devices useful as generators and amplifiers and in particular to high power solid state microwave devices, to high power microwave generators, and amplifiers, to methods of generating high power electromagnetic waves, such as microwaves utilizing solid state means, and to the provision of solid state structures for use in generating and amplifying microwave power. It is an object of the invention to make such novel devices and to practice such methods utilizing prior existing semiconductor fabrication techniques and processes, and in forms and shapes new and novel to the art and related industries.

As an example, a device according to the invention will preferably use a semiconductor in thin sheet form with a DC voltage along the sheet. In one form of the invention, a thin dielectric layer is applied over the semiconductive sheet and a large number of narrow electrically-conductive (e.g.: metal) stripes or discrete elements in other forms are provided on this dielectric, the stripes running perpendicular to the applied DC field. Negative resistance at microwave frequencies is expected for AC fields in the semiconductor parallel to the DC field. Negative material resistivity is not required for operation of this device although materials exhibiting negative resistivity may be utilized. The stripes need not be part of a slow wave propagating circuit, and no external or electrical contact need be made to them. Alternatively, stripes of dielectric or semiconductor material can be used. No p-n junctions as known in conventional semiconductors are required.

An important feature of the invention is that the electrical power which is dissipated as heat occurs in a thin layer over an extended surface area, which may be made very large in comparison with other semiconductor devices. The heat dissipation per unit area of the surface is also sufficiently low that cooling by heat conduction can be effective, preventing excessive temperature rise, even in continuous operation.

Another important feature of the invention is that large active areas may be utilized, even at high microwave frequencies thus permitting the design of very high power devices. There is no evident limit to the active area which can be used.

DESCRIPTION OF THE INVENTION

Exemplary embodiments of the invention, and methods to make them, are described with reference to the accompanying drawings, in which:

FIG. 1A schematically illustrates in plan view a first embodiment of this invention;

FIG. 1B is a cross-section on line B—B of FIG. 1A;

FIG. 2A schematically illustrates another structure in accordance with the invention;

Figure 1A:
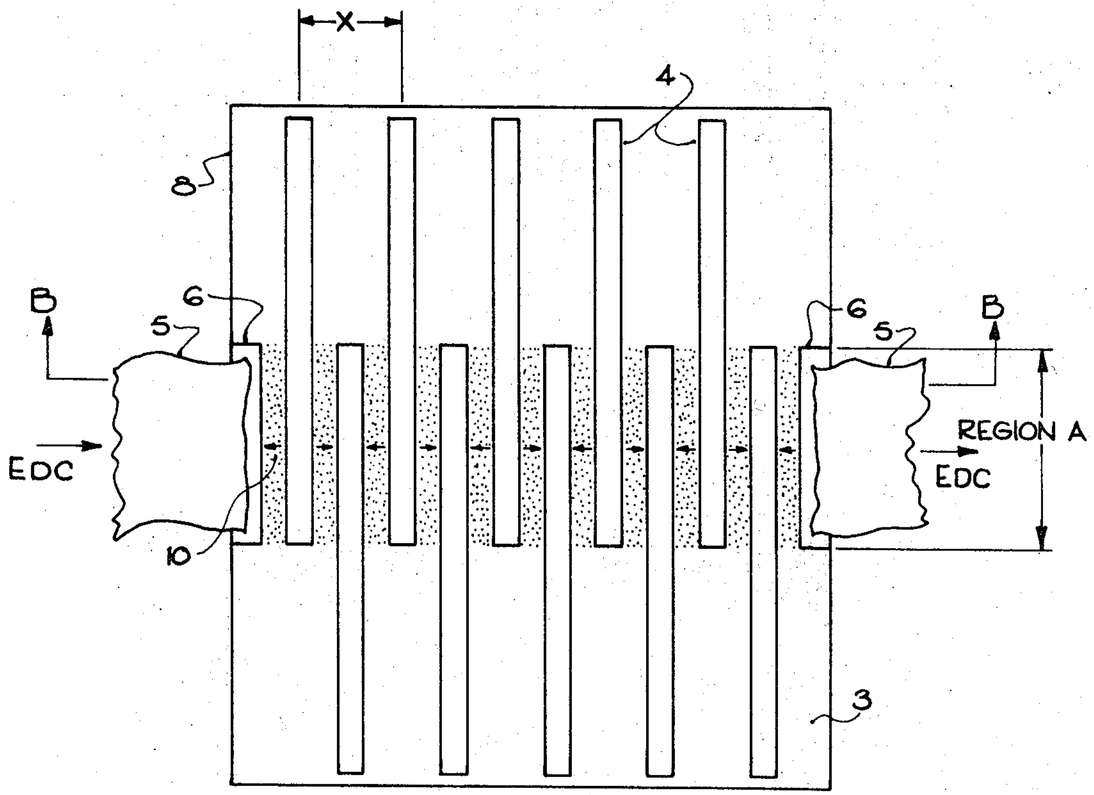
Figure 1B:
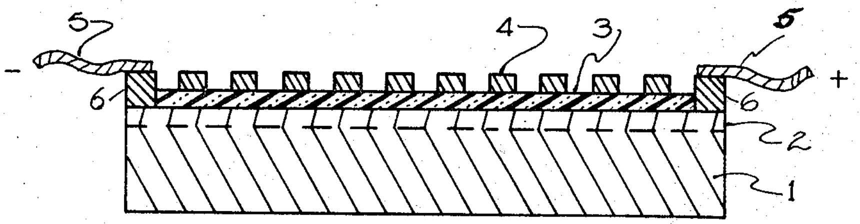

In FIGS. 1A and 1B a thin electrically-conductive layer or sheet 2 of semiconductor material (resistivity e.g.: 1 ohm cm.) such as silicon is provided (e.g.: diffused or epitaxially grown) to a thickness on the order of 1 or 2 microns upon a portion, marked region A approximately 1 mm. wide, of a surface of a semiconductor wafer extending across the wafer between the two contacting zones 6, of a substantially dielectric substrate 1, such as very high resistivity silicon (e.g.: 1000 ohm cm.) approximately a few thousandths of an inch in thickness. Other semiconductor materials such as germanium, gallium arsenide, indium antimonide, gallium antimonide, indium arsenide, germanium telluride, germanium sulfide and diamond may also be used. Above the conductive layer 2 and also the higher resistivity substrate 1 a thin dielectric layer 3 is provided followed on the dielectric layer 3 by an array or mosaic of electrically-conductive (e.g.: metal) stripes 4. In FIG. 1A, the width of the stripes and their spacings are greatly exaggerated for purposes of illustration. In practice the stripes and spacings will be very narrow. (In one embodiment, stripe widths of .0005 cm. might be used, spaced .0005 cm. apart. For this design 100 stripes might be laid down per mm. of wafer surface.) These stripes interlace over the surface region marked A so that the spacing of stripes center to center may be approximately 10 microns in this region. The conductive region 2 exists only under this region A for this embodiment. The total outside dimensions (length and width) of the wafer 8 might be 3 mm. long by 1.2 mm. wide in the device as pictured. However, it is a feature of this invention that much larger areas of semiconductor surface can be used for devices of high power. The two end regions 6 make electrical contact to the conductive layer 2; however, the stripes 4 do not contact the conductive layer. Electrically-conductive contact straps 5 may be bonded to the end regions 6 to provide means for application of a DC voltage to the conductive layer 2.

Figure 6:
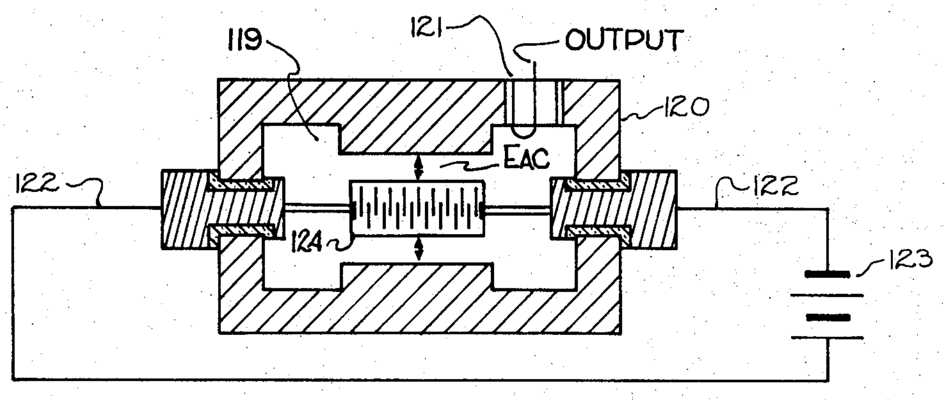
FIG. 6 illustrates schematically another embodiment of a microwave generator utilizing one of the above structures.

When this structure 8 is placed in a resonant cavity 119, as shown schematically in FIG. 6, at a region of high AC electric field ($E_{AC}$) in the plane of the stripes and a suitable DC field is applied to the sheet or layer 2 (from a battery 123 via insulated electrodes 122, 122 in the walls 120 bounding the resonator space 119) in a direction perpendicular to the stripes, theory indicates that a negative resistance develops along the sheet at microwave frequencies, provided that the drift velocity, under influence of the DC field, carries electrons (or holes) a distance slightly greater than the distance X (FIG. 1A) during one wave period at the frequency of interest, and certain other conditions are satisfied. The AC field is assumed here to be given rise to by noise components in the resonator space, and an output can be taken via a coaxial coupler 121.

Figure 8:
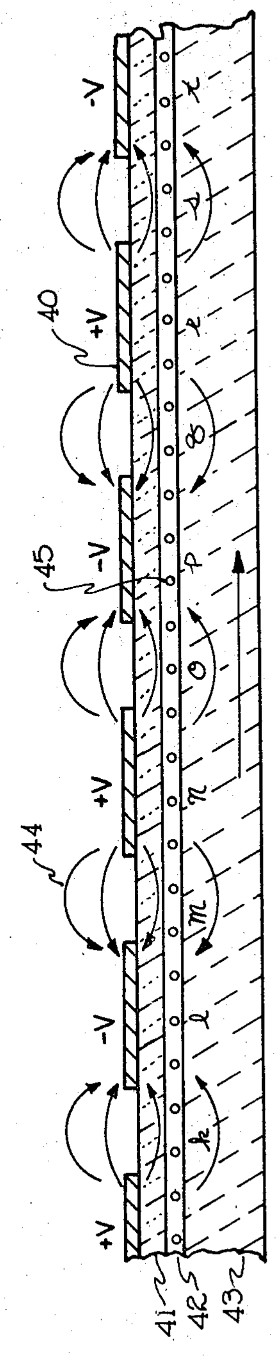
FIGS. 8, 9, 10 are diagrams serving to illustrate the operation of the invention.
Figure 9:
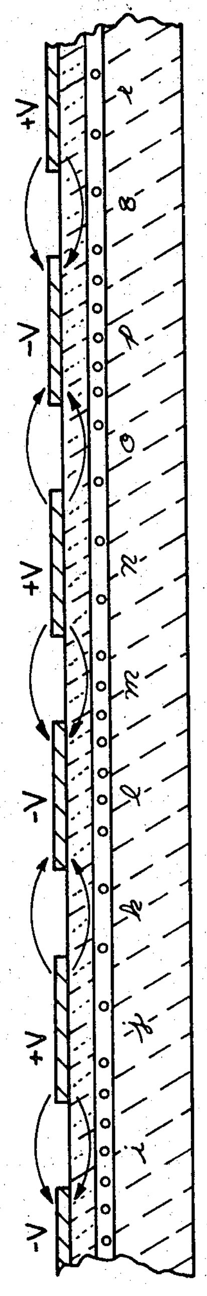
Figure 10:
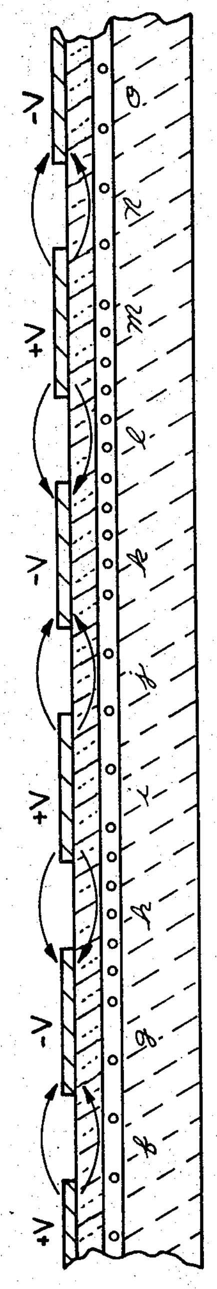

Without intending to limit the scope of the invention, the following is offered as a physical explanation of the mechanism by which the device with the mosaic 4 generates high frequency power. Referring to FIGS. 8, 9 and 10, these figures show three views of the same cross-section enlarged of a small part of the mosaic and semiconductor regions. Here, the mosaic of stripes 40 is shown resting on a dielectric layer 41. This, in turn, rests on the semiconductive sheet 42, which is attached to the insulating (higher resistivity) support 43.

It is assumed here that there is a strong DC electric field along the structure from left to right as seen in these figures. For this discussion, it is assumed that the charge carriers in the semiconductor sheet 42 are positive "holes" 45, moving to the right under the influence of the DC field. (The same principles apply for electrons when the DC field is reversed.) The mosaic of stripes 40 may be activated (as in FIG. 6) by a high frequency AC (i.e. microwave) generator (not shown), with voltages alternating +V, −V, +V, etc., as shown. Electric field lines 44 due to the AC field will exist between the stripes, extending into the conductive layer 42. These field lines and the applied AC voltages vary sinusoidally with time at the high microwave frequencies involved. Three successive time instants are shown respectively in the three figures, separated in time by one-half wave period each from the others. The motion of the holes 45 will be affected by the AC electric fields between the stripes 40 of the mosaic. When and where the AC field points to the right in the semiconductor, the holes move faster. Where the AC field points to the left, the holes move more slowly, but still toward the right unless the AC field has a larger peak magnitude than the applied DC field. For optimum behavior, the parameters of the AC and DC fields should be chosen so that the DC field alone will move any given hole a distance slightly greater than the separation between adjacent stripe centers in one-half of a wave period of time.

In these figures the small circles 45 in the thin conductive zone represent a small fraction of the individual holes. Relatively few are shown compared with the millions of carriers in an actual device. Under the influence of the AC and DC fields, these carriers move non-uniformly collecting together in bunches in some regions and dispersing in other regions. The drift of such a "bunched" stream of charge carriers carries an AC component of electric current.

FIG. 8 shows a possible initial condition with the carriers evenly spaced in the conductive layer 42. Those carriers marked *k*, *o* and *s* move more rapidly at this instant than the average because of the influence on them of the AC field (i.e. they are in an accelerating field). Those marked *m* and *q* move more slowly because they are retarded by the AC field. FIG. 9 shows the positions of the carriers one-half period later of the AC field. The carriers *m* and *q* again are in a retarding AC field; *k* and *o* are again in an accelerating field. In this way the spacing between *k* and *m* becomes less, forming a zone of increased density around *l*. The process goes on in FIG. 10, another half-cycle later, where the carriers are "bunched" around those marked *h*, *l*, etc., and the carrier density is reduced around *j* and *n*. Note also that each high density of bunched region is moving across a gap at a time when the AC field retards their motion. As the carriers continue to drift, this condition repeats at each gap; the bunched regions traversing the gaps always pass at the times when the AC field component opposes their motion. Similarly, the rarefied regions pass the gaps at the times when the AC field is in the direction of their motion. The moving bunched stream of holes carries an AC component and a DC component of current, the AC component, in this case, having an inverse phase compared with the AC field in which they move. This causes AC power to be transferred from the moving carriers to the electrical circuit (e.g.: the microwave circuit in FIG. 6). This can be interpreted also as an effective negative resistance for the AC excitation. The moving stream of carriers induces AC current to flow into and out of the stripes, in inverse phase to the applied voltage, delivering power to the external circuit.

The alternating high frequency electric field pattern illustrated in FIGS. 8, 9, and 10 may be induced in a variety of ways. For example, the structure of FIGS. 1A and 1B may be placed in a resonant cavity as shown in FIG. 6, so that high frequency fields in the cavity are parallel to the direction of the stripes and induce high frequency currents to flow across the slab in this direction. The small arrows 10 shown between the stripes of FIG. 1A illustrates the induced electric field in region A at a given instant of time. It is seen that at any instant, the AC field in region A (FIG. 1A), is in opposite directions on opposite sides of any given stripe. In the same way, a high frequency voltage may be associated with the stripes and this voltage, at any instant, will alternate plus and minus from stripe to stripe along the central region. The extensions of the stripes on either side of the conductive zone region A act as antennae and are equivalent to a parallel array of dipole antennae. These dipoles form coupling means between the conductive sheet 2 and the resonant cavity.

Figure 2A:
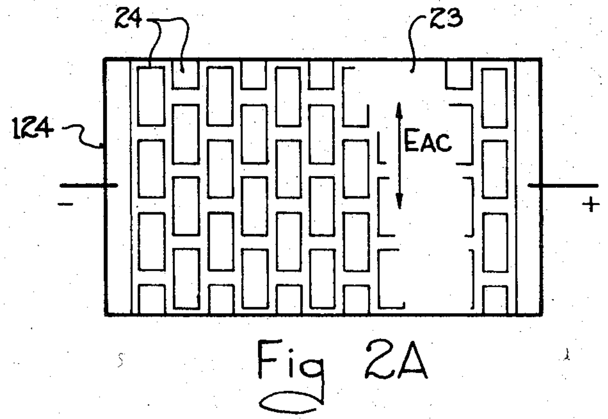
FIG. 2B is an edge view of FIG. 2A showing an enlarged partial view of FIG. 2A.
Figure 2B:
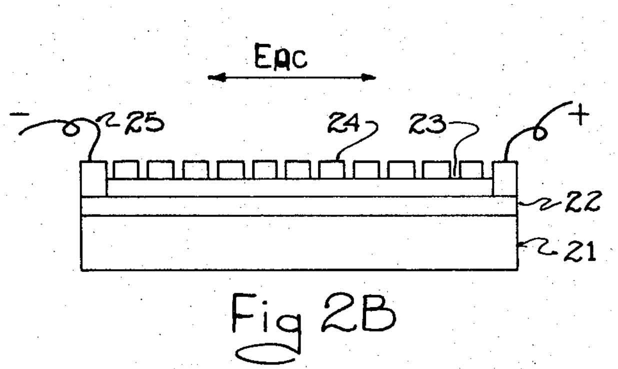
Figure 3:
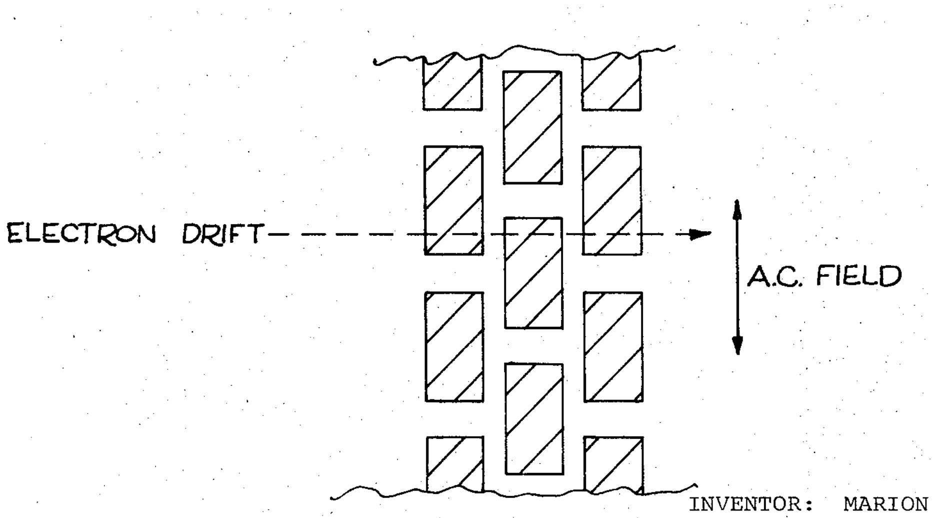
FIG. 3 is an enlarged partial view of FIG. 2A.

One may induce a field pattern of the type shown in FIGS. 8, 9, and 10 into the structures shown in FIGS. 2 and 3. These figures show an extension of the principle of FIG. 1A for the case of a large area of surface of a conductive layer or sheet 22 on a substrate 21 like the substrate 1 of FIG. 1A. The repeatedly interlaced stripes 24 resting on a dielectric layer 23 act as an array or mosaic of dipoles extending in two dimensions. A DC field may be applied via electrodes 25. When placed in a resonant cavity in the same manner as shown in FIG. 6 this structure will be coupled to the cavity electric field to produce an alternating sequence of high frequency voltage between adjacent stripes.

An analysis of FIG. 2A, based upon electromagnetic theory, indicates that the surface zone containing the mosaic, when placed in a high frequency field, has certain properties similar to electrical surface conduction in high frequency fields. Thus within the environment of a waveguide or a cavity resonator, when placed so that an AC field appears in the direction of the long dimension of the mosaic stripes high frequency current will flow in these stripes and fields will appear between the stripes, in the manner shown in FIGS. 8, 9, and 10. Current flow between the stripes will include capacitance "displacement current" plus additional inputs due to motion of bunched stream of carriers in the conductive sheet 22. The latter will, as explained above induce negative conductance behavior. The mosaic has a fine granularity in its structure with its component parts being very small compared with a wavelength of the radiation field. As compared with the cavity or waveguide, the granularity is too fine for its components 24 to be effective as individual components. The spatially alternating fields of FIGS. 8, 9, and 10, do not affect the cavity of waveguide directly. However, at any instant, the currents along the stripes are all in the same direction and there will be an electric field, also unidirectional at any instant, observable as an average, in the direction parallel to the long dimension of the stripes. At a small distance from the surface, only the average fields at any instant are observable, the granularity of mosaic being attenuated. Thus, ignoring the granularity, the surface, in a smoothed or average sense, behaves as a sheet conductor. Conduction in the sheet has two components, a negative conductance and a capacitive susceptance for AC fields parallel to the mosaic stripes.

It is well known that a sheet with positive surface resistivity, placed in a waveguide will attenuate a traveling wave propagating in the waveguide. In an analogous manner, a sheet presenting a surface which exhibits high-frequency negative resistivity will cause such a traveling wave to be amplified as it progresses in the waveguide.

Such a surface may be located in any part of a waveguide or resonator where high frequency fields exist parallel to the surface and depending on the structure of the mosaic and the mode of its use, having its field either parallel or transverse to the direction of stripes. (See FIG. 1A vs. FIGS. 4A and 5.) Thus a structure with a mosaic according to the invention may be placed in a variety of electromagnetic circuits including waveguide, cavity resonators, coaxial or slab transmission lines, etc., and may induce high frequency oscillations or signal amplification as desired by the device designers.

Figure 4A:
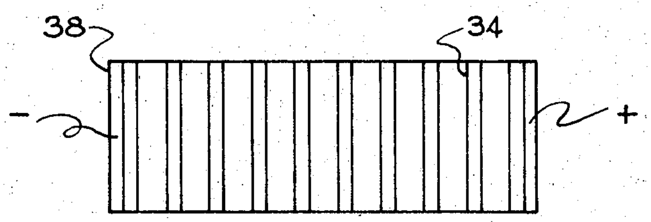
FIGS. 4A and 4B illustrate a variation of the embodiment of FIG. 1A.
Figure 4B:
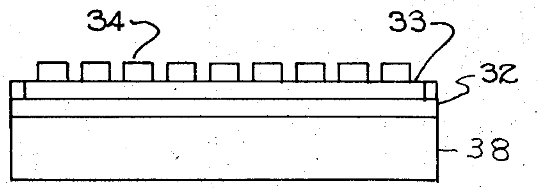
Figure 5:
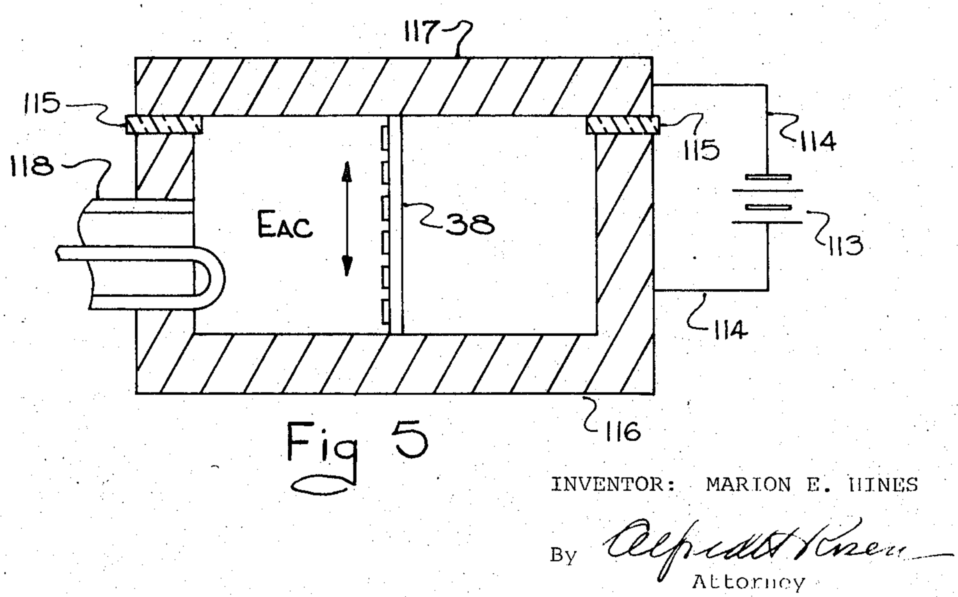
FIG. 5 illustrates schematically one embodiment of a microwave generator utilizing one of the above structures.

Another form of mosaic surface of the device of the invention is illustrated in FIGS. 4A and B, and another mode of using the device is shown in FIG. 5. This conception of this device differs in two regards from that of FIGS. 1A, 2A and 3. Stripes 34 (corresponding to stripes 4 in FIG. 1A), resting on a dielectric layer 33, which in turn rests on a conductive sheet or layer 32 on the substrate 38, extend across the entire surface of the sheet 22. The high frequency electric field in this case is applied across the stripes 34, in the same direction as the DC bias field, and the device is coupled to a resonator as shown in FIG. 5. The resonator in FIG. 5 comprises two electrically conductive members 116 and 117 separated by insulators 115, with the device 38 shown in edge view held between them. A battery 113 connected to the conductive members 116 and 117 by wires 114, 114, applies the DC biasing field to the device across the stripes 34, and the electric field ($E_{AC}$) which may be derived from noise components within the resonator, is applied in the same direction. The output of microwave power is removed via the coaxial coupler 118.

Figure 7:
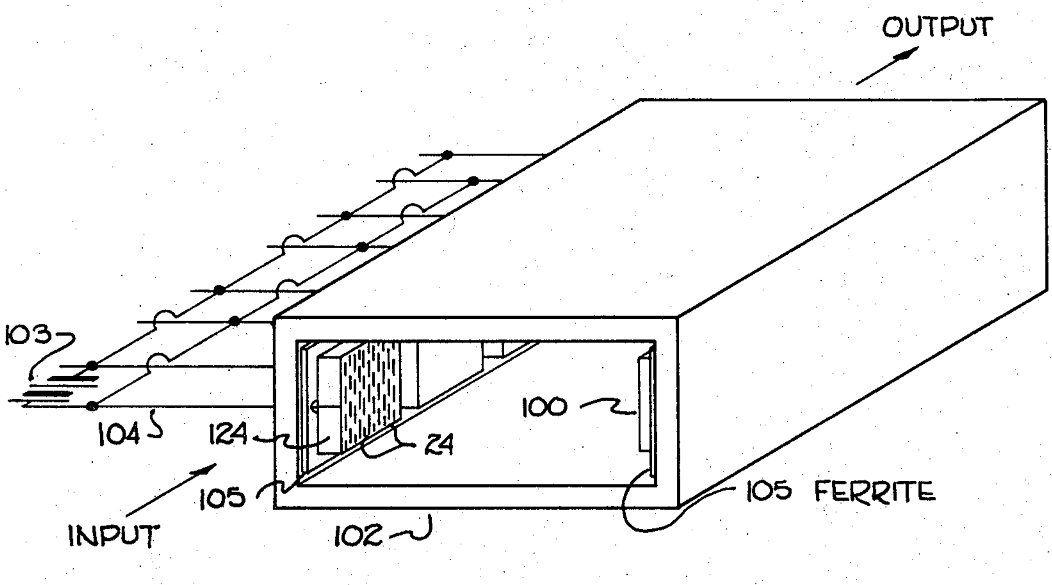
FIG. 7 illustrates schematically an embodiment of a high power solid state amplifier utilizing one of the above structures.

FIG. 7 schematically illustrates a transmission line which represents a general class of networks for propagation of electromagnetic energy. Devices according to the invention are inserted into a waveguide 102, biased by a battery 103 through bias leads 104 passing through walls of the waveguide, and insulated therefrom. Details of the bias connections to the devices 124 are not shown in FIG. 7, since they are obvious from FIG. 2B. The bias leads are insulated from the waveguide walls in any suitable manner (not shown). The mosaic stripes in this configuration will be vertical (i.e.: in the direction extending between the wide walls on the waveguide) as shown and thus in the direction of the high frequency electric field voltage of a wave which may propagate in the waveguide. The devices 124 comprise active elements in slab form 100 which are shown attached to the narrow walls of the waveguide in order to conduct heat to the outside and permit high power dissipation. The devices may be spaced from the waveguide wall by spacers of dielectric material 105, so that insulation is obtained for the DC bias voltage. Also, the mosaic of stripes 24 should be spaced by such dielectric material some slight distance from waveguide wall into a region where the electric field voltage of the waveguide mode being used (e.g.: fundamental) is significant. If the dielectric spacers 105 are made thicker, the mosaic 24 may approach more nearly into the central region of the waveguide for stronger interaction with the high frequency wave. That condition would be more suitable for lower power devices.

The transmission line circuits of FIG. 7 all have a serious drawback, in that amplification will occur for waves traveling in either direction along the line 102. If high gain is attempted in an unbroken length, oscillations can occur unless the lines are accurately matched in impedance to the load and source. Reflected waves can make multiple-transits, with gain in both directions, causing undesired oscillation. To avoid such oscillations, it is proposed that ferrite material 100 be inserted into the line 102 of the types which give greater power absorption for one direction of propagation than the other. Many such techniques are well known in the art.

Figure 11:
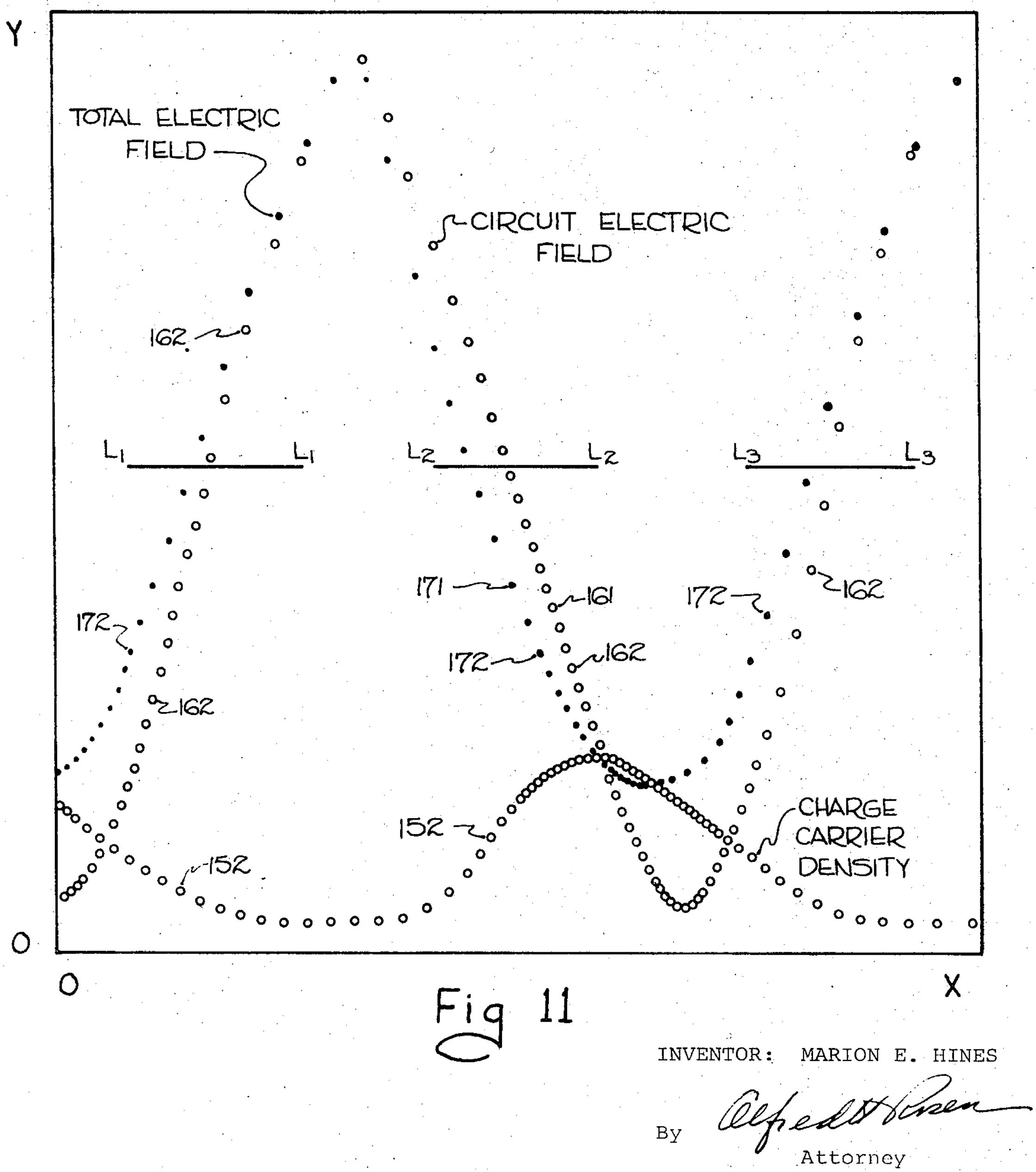
FIG. 11 is a set of graphs showing the interaction of electron charge density, circuit electric field and total electric field at one instant of time in devices according to the invention.

FIG. 11 shows a graphical set of data which applies to the type of structure illustrated in FIGS. 8, 9, 10. These data were obtained by an analysis of this device using an electronic computer, and these graphs were drawn and plotted automatically on the computer. The horizontal axis (O–X) represents distance along the surface supporting the mosaic across the stripes, including only three of the array of stripes. The vertical axis (O–Y) shows the magnitude of the electric fields in the conductive surface in the longitudinal direction at a time when the total voltage on the stripes is a maximum. This includes both the bias field and the AC components, zero field being at bottom of the chart. The bias field is the average value at one-half the maximum vertical range. The three short straight lines $L_1L_1$–$L_2L_2$–$L_3L_3$ schematically represent the lateral extent of the cross section (width) of the stripes. The maximum and minimum fields occur between the stripes. The circles and dots represent data for representative charge carriers originally evenly spaced. The lower graphical representation 151 shows the density of the carriers 152 after bunching. This is shown in two ways simultaneously; first in that the horizontal spacing of the circles 152 shows more crowding where the density is high and secondly the height of this curve represents density directly. The sinusoidal curve 161 above represents an approximation to the electric field induced by the stripe voltages at the instant being represented. These data points are plotted as circles 162 for the condition at the positions of the same set of representative charge carriers. This explains the nonuniformity in spacing of the plotted data. A third set of data appears as a distorted sine wave similar to that induced by the voltages. These data points 172 represent the total longitudinal electric field at each representative charge carrier and includes a contribution due to mutual repulsion of the charge carriers which appears when bunching occurs.

For the computer analysis described above, the following conditions were assumed:

Peak AC voltage between stripes—7 volts.
Stripe spacing, center to center—.0010 cm.
DC electric field—10,000 v./cm.
Dielectric layer thickness—.00005 cm.
DC surface current—120 ma./cm.
Incremental mobility of carriers—100 (cm./sec.)/(volt/cm.).
Zero-field mobility—3300 (cm./sec.)/(volt/cm.).
Frequency—2800 mHz.
Drift velocity—$6\times10^6$ cm./sec.
Dielectric constant—10
Input DC power—1200 watts/cm.$^2$.

For these conditions, steady state operating parameters were predicted by the analysis as follows:

Peak high frequency surface current—117 ma./cm.
Power output at 2800 mHz.—142 watts/cm.$^2$.

Study of graphs according to FIG. 11 shows that the wave of carrier charge density travels from gap to gap in synchronism with the periodicity of the applied high frequency AC field. At each gap between stripes, the wave of high charge density traverses this region during the interval when the AC component of electric field opposes motion of the holes most strongly. This is the condition which provides for high frequency negative resistance effects and the generation of high frequency power.

The embodiments of the invention which have been illustrated and described herein are but a few illustrations of the invention. Other alternative circuit arrangements may be made within the scope of this invention by those skilled in the art. No attempt has been made to illustrate all possible embodiments of the invention, but rather only to illustrate its principles and the best manner presently known to practice it. Therefore, while certain specific embodiments have been described as illustrative of the invention, such other forms as would occur to one skilled in this art on a reading of the foregoing specification are also within the spirit and scope of the invention, and it is intended that this invention includes all modifications and equivalents which fall within the scope of the appended claims.

What is claimed is:

1. A solid-state electromagnetic wave device comprising a body of semiconductor material having substantial conductivity on at least one free conductive surface, a dielectric material overlying and contiguous to said conductive surface, a periodic mosaic pattern of disconnected electromagnetic wave energy-coupling elements arrayed on said dielectric material for coupling to an electromagnetic field incident on said body and means to apply a bias potential to said conductive surface to induce in and parallel to said conductive surface a unidirectional drift of electrons or holes, wherein the conductive surface is contiguously positioned as a zone under a portion of the dielectric material, and wherein the periodic mosaic pattern of disconnected electromagnetic wave energy-coupling elements comprises parallel conductive stripes on said dielectric material alternately extending across and beyond either side of said conductive zone, and wherein said bias means provides a voltage gradient in said conductive surface in a direction substantially perpendicular to said stripes.

2. A solid-state electromagnetic wave device comprising a body of semiconductor material having substantial conductivity on at least one free conductive surface, a dielectric material overlying and contiguous to said conductive surface, a periodic mosaic pattern of disconnected electromagnetic wave energy-coupling elements arrayed on said dielectric material for coupling to an electromagnetic field incident on said body and means to apply a bias potential to said conductive surface to induce in and parallel to said conductive surface a unidirectional drift of electrons or holes, wherein the periodic mosaic pattern is comprised of a plurality of equidimensioned discrete conductive stripes aligned along their longitudinal dimension in a row on said dielectric material said row of conductive stripes extending in its longitudinal direction to the full width of said conductive surface and with said row of discrete conductive stripes periodically repeated in a lateral direction to form a multiplicity of rows parallel one to the other, and with alternate rows staggered longitudinally one with the other, said rows of discrete disconnected conductive stripes forming an array of conductive stripes interlaced bricklayer fashion on the surface of said dielectric material.

References Cited

UNITED STATES PATENTS

| | | | |
|---|---|---|---|
| 3,262,059 | 7/1966 | Gunn et al. | 330—5 |
| 3,295,064 | 12/1966 | White | 328—58 |
| 3,436,624 | 4/1969 | Wesemeyer | 317—237 |
| 3,407,341 | 10/1968 | Franks | 317—234 |

NATHAN KAUFMAN, Primary Examiner

U.S. Cl. X.R.

317—234; 330—38